United States Patent [19]

Wada

[11] Patent Number: 4,623,875

[45] Date of Patent: Nov. 18, 1986

[54] CODING DEVICE FOR IMAGE PROCESSING APPARATUS

[75] Inventor: Yoshinori Wada, Miura, Japan

[73] Assignee: Ricoh Company, Ltd., Tokyo, Japan

[21] Appl. No.: 714,872

[22] Filed: Mar. 22, 1985

[30] Foreign Application Priority Data

Mar. 27, 1984 [JP] Japan .................................. 59-57399

[51] Int. Cl.[4] .......................... H04N 1/40; H04N 1/00
[52] U.S. Cl. ............................... 340/347 DD; 358/261
[58] Field of Search ................ 340/347 DD; 358/260, 358/261; 382/56

[56] References Cited

U.S. PATENT DOCUMENTS 4,097,903  6/1978  Nakagome et al. ................. 358/261
4,207,599  6/1980  Murayama et al. ..... 340/347 DD X Primary Examiner—William M. Shoop, Jr.
Assistant Examiner—Sharon D. Logan
Attorney, Agent, or Firm—Oblon, Fisher, Spivak, McClelland & Maier

[57] ABSTRACT

A coding device for a facsimile or like image processing apparatus is disclosed. The device increases the data compression ratio to more than 1 and maintains a data processing rate higher than a predetermined value.

10 Claims, 12 Drawing Figures

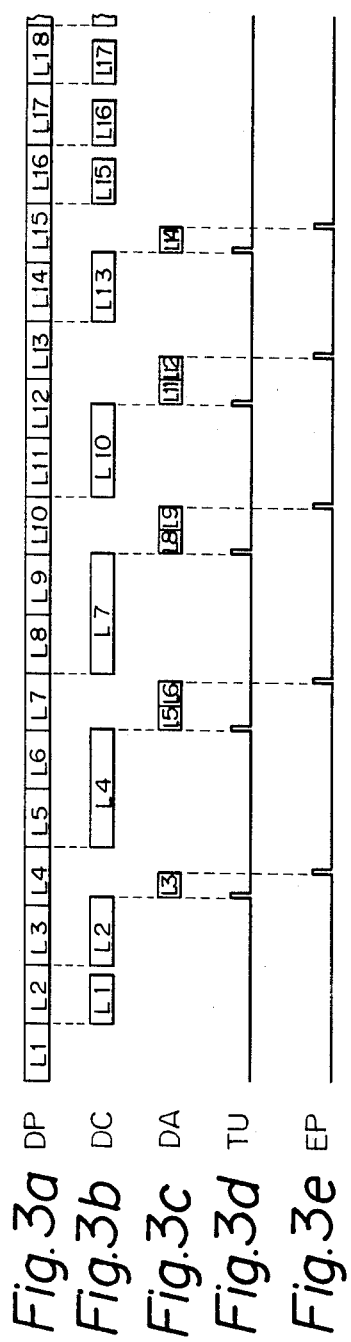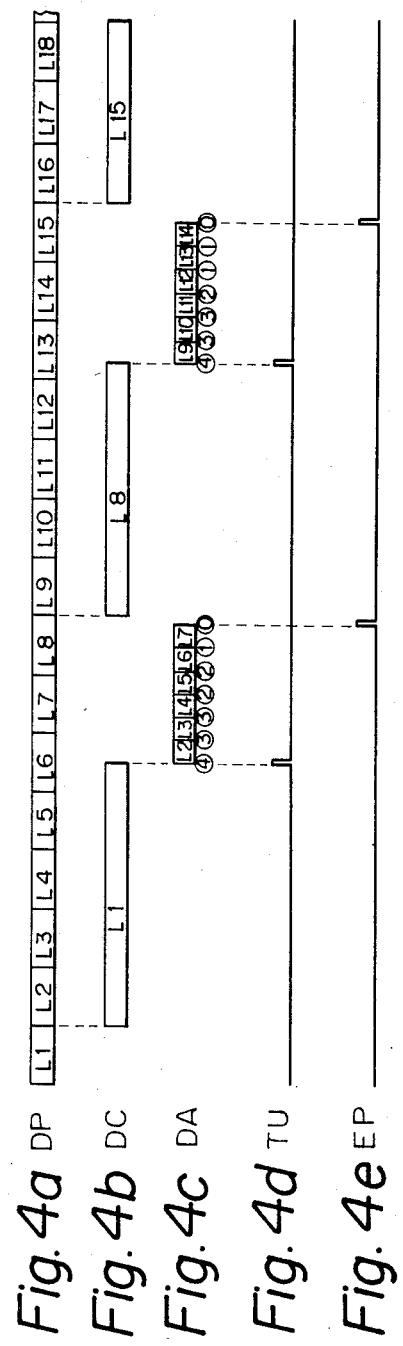

CODING DEVICE FOR IMAGE PROCESSING APPARATUS

BACKGROUND OF THE INVENTION

The present invention relates to a coding device for an image processing apparatus such as a facsimile apparatus.

In an image processing apparatus, typically a facsimile apparatus, picture data are usually coded before transmission in order to enhance the transmission efficiency of images. The problem hitherto encountered with picture data coding is that the number of bits of data after coding is not always smaller than that of data before coding and it is not seldom that the former is larger than the latter. In the case of a modified Huffman (MH) run-length coding system, for example, a stream of 2,048 bits which constitutes one line of picture data (applying to a B4 format and a resolution of 8 dots per millimeter) turns into a stream of 32 to 9,236 bits inclusive of an end-of-linesync (EOL) code. A few systems have been proposed in the image processing art which are elaborated to make the number of bits of picture data produced by a coding device at least smaller than that of noncoded data, as will be described.

In accordance with a first proposed system, one unit block of data (one line of data concerning facsimile) are coded and stored in a buffer memory, while the amount of data being stored is constantly monitored. As soon as the number of the stored data bits exceeds the number of bits which constitutes one unit block of non-coded data, the coding operation is interrupted and that unit block of data are directly outputted as non-coded data.

A second proposed system is to count the number of runs (white/black transition points) in each one unit block of data before coding the data, and output the data without coding them if the counted number of runs is greater than a predetermined one.

A third proposed system is such that when the number of bits of a unit block of coded data has become greater than that of a unit block of non-coded data, the subsequent unit block or blocks are outputted as non-coded data until a unit block having a smaller number of bits of coded data than non-coded data appears. Then, coded data are outputted for the next unit and subsequent unit blocks.

All such prior art systems applied to facsimile, for example, allow one line of data, 2,048 bits, to be transmitted in 32 to (2,048 plus control codes) bits, which is a substantial improvement in transmission efficiency. In addition, where the output coded data are to be routed to a store, it is possible to scale down the capacity of the store.

However, the first and second systems commonly suffer from a drawback that a lot of buffer memories are indispensable. Another drawback is that since the first system has to code even the data which do not have to be coded and the second system has to count the runs beforehand to selectively code data based on the number of runs, the first and second systems are redundant and complicated in processing and, moreover, consume a long period of processing time due to the need for repeated entry of the same non-coded data into a coding device. Meanwhile, the third system is inherently intricate in control inasmuch as it has to code data even while non-coded data are being outputted.

SUMMARY OF THE INVENTION

It is therefore an object of the present invention to provide a coding device for an image processing apparatus which achieves a simple construction and a short processing time by effecting an efficient coding process.

It is another object of the present invention to provide a generally improved coding device for an image processing apparatus.

A coding device of the present invention comprises an input section for inputting non-coded data, a memory for momentarily storing the inputted non-coded data, an encoder for run-length coding the non-coded data by reading the non-coded data one unit block at a time out of the memory, and a selection control for monitoring and comparing with a predetermined period of time a period of time consumed by the encoder in coding a unit block of data and, based on result of the comparison, determining which of coded data and non-coded data is to be outputted for the next and subsequent unit blocks of the noncoded data.

In accordance with the present invention, a coding device for a facsimile or like image processing apparatus is disclosed. The device increases the data compression ratio to more than 1 and maintains a data processing rate higher than a predetermined value.

The above and other objects, features and advantages of the present invention will become apparent from the following detailed description taken with the accompanying drawings.

BRIEF DESCRIPTION OF THE DRAWINGS

FIGS. 3a–3e show data blocks and signal waveforms representative of an exemplary operation of the device shown in FIG. 1; and FIGS. 4a–4e show data blocks and signal waveforms representative of another exemplary operation of the device shown in FIG. 1.

DESCRIPTION OF THE PREFERRED EMBODIMENT

While the coding device for an image processing apparatus of the present invention is susceptible of numerous physical embodiments, depending upon the environment and requirements of use, a substantial number of the herein shown and described embodiment have been made, tested and used, and all have performed in an eminently satisfactory manner.

Figure 1:
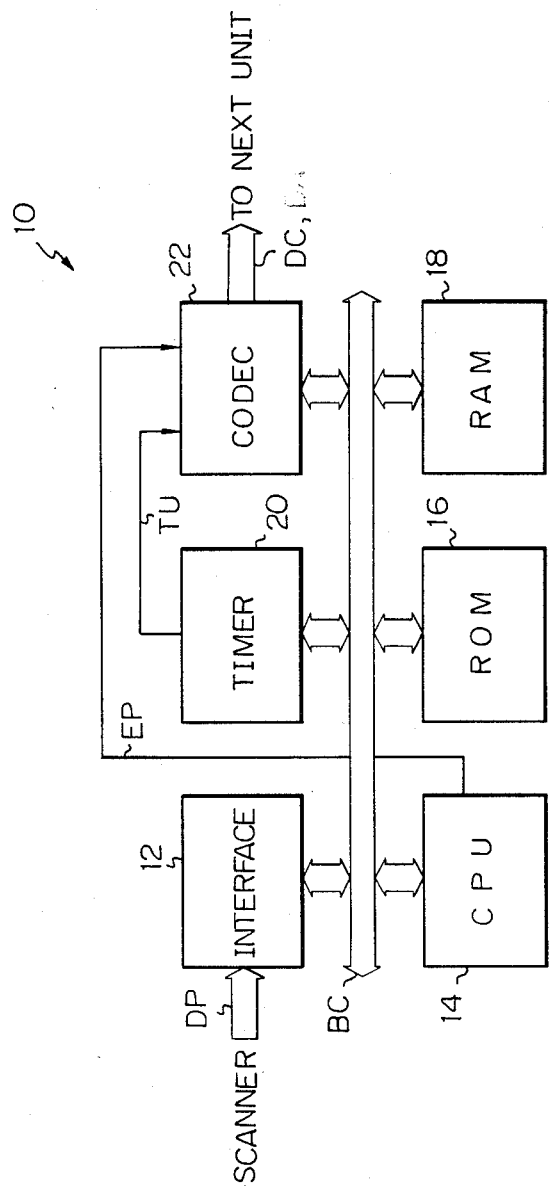
FIG. 1 is a block diagrm of a coding device in accordance with the present invention.

Referring to FIG. 1 of the drawings, a coding device embodying the present invention is shown and generally designated by the reference numeral 10. In this particular embodiment, the coding device 10 is assumed to be installed in a facsimile apparatus by way of example. The device 10 comprises an interface 12 to which a picture signal, or picture data, DP is applied from a scanner or like picture signal generator (not shown), a central processing unit (CPU) 14 for executing predetermined processings, a read only memory (ROM) 16 for storing a control program and others assigned to the CPU 14, a random access memory (RAM) 18 for providing the CPU 14 with a work area and constituting a first-in-first-out (FIFO) line buffer adapted to store the picture signal DP, a timer 20 to be triggered by the CPU 14 with time data set therein, and a coder/decoder (CODEC) 22 for converting the image signal DP to an MH code and vice versa.

Various data are exchanged between the interface 12, CPU 14, ROM 16, RAM 18, timer 20 and CODEC 22 by way of a common bus BC. The picture signal DP is transferred to the interface 12 by each unit block, or one line, within a predetermined period of time such as 2.5 milliseconds.

Figure 2:
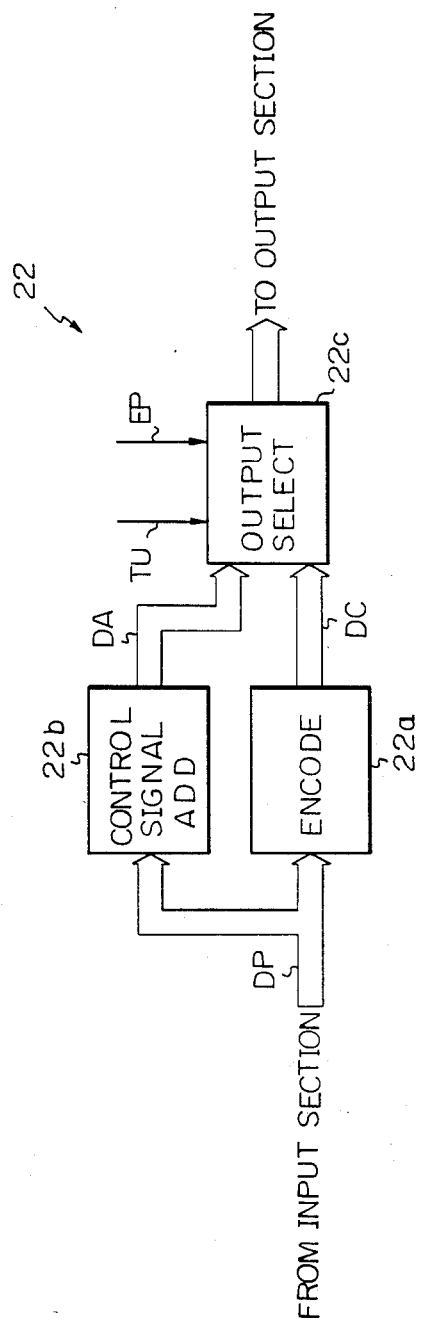
FIG. 2 is a block diagram of an encoder section of a coder/decoder included in the device of FIG. 1.

Referring to FIG. 2, part of the CODEC 22 to which a coding function is assigned is shown. A picture signal DP entered through an input section (not shown) is applied to an encode section 22a and a control signal add section 22b. The encode section 22a converts the picture signal DP to an MH code and delivers the coded data DC to an output select section 22c. The control code add section 22b serves to add to one line of picture signal DP an EOL code and an identification code which shows that the input data are non-coded data. Another function of the section 22b is unconditionally inserting a ONE after input data when the input data are a sequence of five consecutive ZEROs. Further, the section 22b prepares an additional picture signal DA by processing one line of picture signal DP in about 1 millisecond and applies it to the output select section 22c.

The picture signal DP is momentarily stored in the RAM 18, or FIFO line buffer, line by line by the CPU 14. This picture signal DP is transferred to the encode section 22a of the CODEC 22 whereupon the section 22a starts on a coding operation, while at the same time the CPU 14 triggers the timer 20 after setting time data, 2.5 milliseconds, therein. At the beginning, the output select section 22c selects the coded data DC and transfers it to an output section (not shown). On completion of coding one line, the codec 22 informs the CPU 14 of it whereby the CPU 14 resets the timer 20 to stop its timing operation. When the time is up, the timer 20 applies a timer up signal TU to the output select section 22c. Then, the section 22c starts to couple the additional image signal DA, instead of the coded data DC, to the output section and remains in such a condition until an empty signal EP showing that the FIFO line buffer has been emptied arrives thereat.

Assume that, as shown in FIG. 3a, image signals DP representative of individual lines (L1-L18 . . . ) are sequentially fed from the interface 12 to the FIFO buffer of the RAM 18. FIG. 3b shows coded data DC, FIG. 3c additional picture signal DA, FIG. 3d a timer up signal TU, and FIG. 3e an empty signal EP. Labels inside the various blocks of the coded data DC and additional picture signal DA indicate mutually corresponding line numbers.

In FIGS. 3a-3e, the first line L1 is shown as having been coded within a shorter period of time than 2.5 milliseconds. Then, no timer up signal TU is generated and the coded data DC are selected for the next line L2, too. Since the time consumed to code the line L2 is longer than 2.5 milliseconds, a timer up signal TU appears before coding of the line L2 completes and, therefore, the additional picture signal DA is selected for the subsequent line L3. At the instant when the coding operation on the line L2 has ended, the picture signal DP associated with the line L3 alone has been fully inputted to the FIFO line buffer and, hence, the CPU 14 applies an empty signal EP to the output select section 22c of the codec 22 as soon as the additional picture signal DA associated with the line L3 is fully outputted. For the subsequent line L4, the section 22c selects the coded data DC.

The above procedure is repeated thereafter so that the coded data DC or the additional picture data DA is selected on a lineby-line basis to be sent to a unit located at the next stage.

Concerning a facsimile apparatus, one line of picture signal DP comprises 2,048 bits as previously stated, while the maximum value of MH coded data is 9,236 bits. It, therefore, possibly occurs that the coded data DC becomes about 4.5 times longer than one line of picture signal DP at the maximum. Where coded data DC each having such a maximum length appear in a sequence, the various signal described above will be generated as shown in FIGS. 4a-4e. In FIG. 4, each of the circled numerals shown below the blocks of the additional picture signal DA indicates the number of lines completely stored in the FIFO line buffer at that time point. Specifically, when coding of the line L1 has completed, the FIFO line buffer has stored four lines of picture signals DP, L2-L5, and is storing the picture signal DP associated with the line L6. It follows that a FIFO line buffer which accommodates only five lines of picture signals DP suffices the purpose. Since one line of picture signal DP comprises 2,048 bits, the required capacity of the FIFO line buffer is not more than about 10,240 (10K) bits.

As for an ordinary facsimile document, consecutive lines are intimately correlated to each other. For example, even a transition from a background of a document to a character does not entail a significant change between immediately neighboring lines concerning the number of bits of coded data, that is, a line with a transitional number of bits exists; even if the number of bits of coded data exceeds that of non-coded data, the difference will be negligible at the transition point and that line can be directly outputted as coded data without significantly affecting the efficiency. The same holds true even of a transition from a character to a background because the efficiency will not be seriously affected even if a change from non-coded data to coded data occurs at the next line.

The present invention, therefore, does not bring about much of deterioration in efficiency, allows a data transfer rate to be surely suppressed to below a predetermined one, and offers an improvement in data compression ratio. What has been described hereinabove also holds true of any other kind of image information and, hence, the present invention is effectively applicable to apparatuses other than a facsimile apparatus as well.

In summary, it will be seen that the present invention provides a coding device for an image processing apparatus which despite its simple construction makes the data compression ratio greater than 1 and sets up a data processing rate higher than a certain desirable value.

Various modifications will become possible for those skilled in the art after receiving the teachings of the present disclosure without departing from the scope thereof.

What is claimed is:

1. A coding device comprising:
    input means for inputting non-coded data;
    memory means for momentarily storing the inputted non-coded data;
    encoder means for run-length coding the non-coded data by reading the non-coded data one unit block at a time out of said memory means;

timer means producing a timing signal after a predetermined fixed time; and selection control means for monitoring and comparing said predetermined period of time with the period of time consumed by said encoder mean in coding a unit block of data and, based on a result of the comparison, determining which of coded data and non-coded data is to be outputted for the next and subsequent unit blocks of the non-coded data.

2. A coding device as claimed in claim 1, wherein the input means comprises an interface.

3. A coding device as claimed in claim 1, wherein the memory means comprises a random access memory which constitutes a first-in-first-out line buffer for storing the inputted non-coded data.

4. A coding device as claimed in claim 1, wherein when the buffer memory is emptied the selection control means selects coded data for the next and subsequent unit blocks of non-coded data.

5. A coding device comprising:

input means for inputting non-coded data;

memory means for momentarily storing the inputted non-coded data and producing an empty signal when said memory is emptied of said non-coded data;

encoder means for run-length coding the non-coded data by reading the non-coded data one unit block at a time out of said memory means;

code adding means for adding at least one additional signal to said non-coded data;

timer means producing a timing signal after a predetermined fixed time; and selection control means for selecting between the output of said code adding means and the output of said encoder means for the next block of data by determining which of said empty signal and said timing signal occurs first.

6. A coding device according to claim 5, wherein said at least one additional signal is an end of line code.

7. A coding device according to claim 5, wherein said at least one additional signal is a code identifying the data as non-coded data.

8. A coding device according to claim 5, wherein said at least one additional signal is a ONE after an input data of five consecutive ZEROs.

9. A coding device according to claim 5, wherein if said empty signal occurs first, the selection control means selects the output of said encoder means.

10. A coding device according to claim 5, wherein if said timing signal occurs first, the selection control means selects the output of said code adding means.

* * * * *